(12) United States Patent
Kunkel et al.

(10) Patent No.: US 6,842,222 B2
(45) Date of Patent: Jan. 11, 2005

(54) METHOD OF REDUCING PITCH ON SEMICONDUCTOR WAFER

(75) Inventors: Gerhard Kunkel, Radebeul (DE); Shahid Butt, Ossining, NY (US); Alan Thomas, Hughsonville, NY (US); Juergen Preuninger, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/406,888

(22) Filed: Apr. 4, 2003

(65) Prior Publication Data

US 2004/0196445 A1 Oct. 7, 2004

(51) Int. Cl.$^7$ .......................... G03B 27/42; G03B 27/32
(52) U.S. Cl. ........................ 355/53; 355/77; 430/311
(58) Field of Search ...................... 430/5, 22, 30; 355/53, 77, 67; 250/492.1, 492.2

(56) References Cited

U.S. PATENT DOCUMENTS

| | | | | |
|---|---|---|---|---|
| 5,327,515 A | * | 7/1994 | Anderson et al. | ........... 385/123 |
| 5,636,004 A | | 6/1997 | Ootaka et al. | |
| 5,703,675 A | * | 12/1997 | Hirukawa et al. | ............ 355/53 |
| 5,903,689 A | * | 5/1999 | Painchaud et al. | ............ 385/37 |
| 6,249,335 B1 | * | 6/2001 | Hirukawa et al. | ............ 355/53 |

* cited by examiner

*Primary Examiner*—Alan Mathews
(74) *Attorney, Agent, or Firm*—Lerner, David, Littenberg, Krumholz & Mentlik, LLP

(57) ABSTRACT

A projected image is formed during a material substrate. A photolithographic mask is illuminated with substantially coherent light at an oblique angle of incidence with respect to a surface of the photolithographic mask. The photolithographic mask includes a substantially transparent mask substrate and one or more lines and spaces patterns formed on the mask substrate and having a periodicity P. The mask substrate includes at least one phase shifting region. At least part of the light that is transmitted through the photolithographic mask is collected using one or more projection lenses which project the portion of the transmitted light onto the material substrate. The material substrate is disposed substantially parallel with, but at a distance from, a focal plane of the projection lens system. The phase shifting region of the mask substrate and the distance from the focal plane are selected such that a substantially focused image is projected onto the material substrate that includes the lines and spaces patterned but with a periodicity P/2.

12 Claims, 2 Drawing Sheets

METHOD OF REDUCING PITCH ON SEMICONDUCTOR WAFER

BACKGROUND OF THE INVENTION

The present invention relates to photolithography methods and, more particularly, to optical lithography methods for forming fine-sized patterns on a wafer or other substrate, such as using a photolithographic mask and a projection lens.

In existing projection systems used in optical photolithography, a quasi-monochromatic, spatially incoherent light source of wavelength $\lambda$ is used to illuminate a photolithographic mask having various patterns, such as a periodic pattern of equally spaced lines. The illuminating beam is usually collimated to ensure a highly uniform intensity distribution at the plane of the mask, and an adjustable condenser stop is used to control the degree of coherence of the illuminating beam. The light is transmitted through the mask and collected by a projection lens which images the mask patterns onto a wafer located at the image projection plane, typically at a predetermined reduction ratio.

In such projection systems, a lines and spaces pattern on the mask diffracts the illuminating beam and forms a plurality of light beams that pass through a projection lens. An optical image of the lines and spaces pattern is formed on the wafer when the light beams interfere with each other. The smaller the pitch of the lines and spaces pattern on the mask, however, the larger the angle at which light diffracted by the mask spreads. Thus, if the pitch of the lines and spaces pattern is sufficiently small, the angle defined by two adjacent diffracted light beams is large enough for the first order and higher order diffracted light beams to impinge outside the projection lens so that no optical image is formed on the wafer.

To print such smaller lines and spaces patterns on a wafer, projection lenses having larger numerical apertures are used to accept larger incidence angles of diffracted light. The numerical aperture (NA) of a projection lens is defined as $NA = \sin \theta$, where $\theta$ is the half-angle of a cone that is subtended by the clear aperture of the projection lens at the wafer. As an alternative, the exposure wavelength is decreased to decrease the angle of diffraction occurring at the mask. In both methods, however, as the lines and spaces patterns that are to be printed approach submicron sizes, the contrast of the patterns formed on the wafer deteriorates, and the depth of focus decreases. As a result, neither alternative is practical at these smaller dimensions.

To form finer lines and spaces patterns without sacrificing contrast or depth of focus, a phase-shifting mask is used. The optical phase of light transmitted through some or all of the mask is changed by changing the thickness of the transparent regions of the mask, either by depositing additional transparent material where needed or by removing a thin layer from the mask at specific locations, thereby selectively adjusting the transmitted optical phase at these locations. Using the phase of the light, the phase-shifting mask eliminates the zero-th order diffracted light beam, namely the light diffracted by the mask pattern in a direction parallel to the optical axis of the projection lens, which would otherwise cause deterioration in the contrast. Only first order diffracted light beams, which are generated in directions symmetrical with respect to the optical axis, pass through the projection lens and interfere to form the optical image on the image projection plane. As a result, the incidence angle of the interfering light beams can be the maximum angle of incidence of the projection lens, thereby increasing the depth of focus and allowing for the printing of finer lines and spaces patterns.

A further alternative using a projection system is described in U.S. Pat. No. 5,636,004, titled "Projection Exposure Method and Apparatus" to Ootaka, et al., the disclosure of which is incorporated herein by reference. A conventional chrome-on-glass mask having a lines and spaces pattern with a pattern pitch 2L, where L is a value between $0.5 \lambda/NA$ to $1.0 \lambda/NA$, is illuminated with vertically incident light to form zero-th order, first order and higher order diffracted light beams. The zero-th order and first order diffracted light beams pass through a projection lens and interfere with each other on the image projection plane to form an optical image on the image projection plane. The wafer is first exposed at a distance z from the focal plane of the projection lens, and then the wafer is exposed again after the wafer is moved along the optical axis by a distance $\Delta$, where the value of $\Delta$ is chosen such that a lines and spaces image having a pattern pitch L is formed on the wafer by the interference between the +1st-order (positive first order) diffracted light beam and the −1st-order (negative first order) diffracted light beam without any dependence on the value of the defocus distance z.

The above methods, however, require that wafer be illuminated with vertically incident light, also known as axially incident light. As an example, if the method described in U.S. Pat. No. 5,636,004 is carried using non-vertically incident light, the intensities of the +1st-order diffracted light beam and the −1st-order diffracted light beam will not be of the same intensity so that the two beams do not interfere completely and will degrade the pattern formed on the wafer.

It is therefore desirable to provide a method for forming fine-sized patterns on a wafer without requiring that the light be vertically incident.

SUMMARY OF THE INVENTION

The present invention provides a method of reducing the pitch of lines and spaces patterns formed on a semiconductor wafer or other material substrate using diffracted light beams of ordinarily different amplitudes where a half-tone phase shifting mask is used to adjust the intensities of the diffracted light beams.

In accordance with an aspect of the invention, a projected image is formed on a material substrate. A photolithographic mask is illuminated with substantially coherent light at an oblique angle of incidence with respect to a surface of the photolithographic mask. The photolithographic mask includes a substantially transparent mask substrate and one or more lines and spaces patterns formed on the mask substrate and having a periodicity P. The mask substrate includes at least one phase shifting region. At least part of the light that is transmitted through the photolithographic mask is collected using one or more projection lenses which project the portion of the transmitted light onto the material substrate. The material substrate is disposed substantially parallel with, but at a distance from, a focal plane of the projection lens system. The phase shifting region of the mask substrate and the distance from the focal plane are selected such that a substantially focused image is projected onto the material substrate that includes the lines and spaces patterned but with a periodicity P/2.

The photolithographic mask may be a half-tone phase shifting mask. The lines and spaces pattern of the photolithographic mask may diffract light transmitted through the photolithographic mask to form a diffraction pattern which has at least a zero-th order light beam, positive and negative first order light beams and positive and negative second order light beams, where the projection lens collects the zero-th order light beam, the positive or negative first order light beam, and its corresponding second order light beam, and where the phase shifting region of the mask alters the intensity of the zero-th order and second order light beams to be substantially equal.

The foregoing aspects, features and advantages of the present invention will be further appreciated when considered with reference to the following description of the preferred embodiments and accompanying drawings.

DETAILED DESCRIPTION

The present invention provides a method of utilizing the full resolution capability of a projection system using oblique illumination, phase shift masking and an image reversal effect that occurs when exposing a periodic pattern with highly coherent light.

Figure 1:
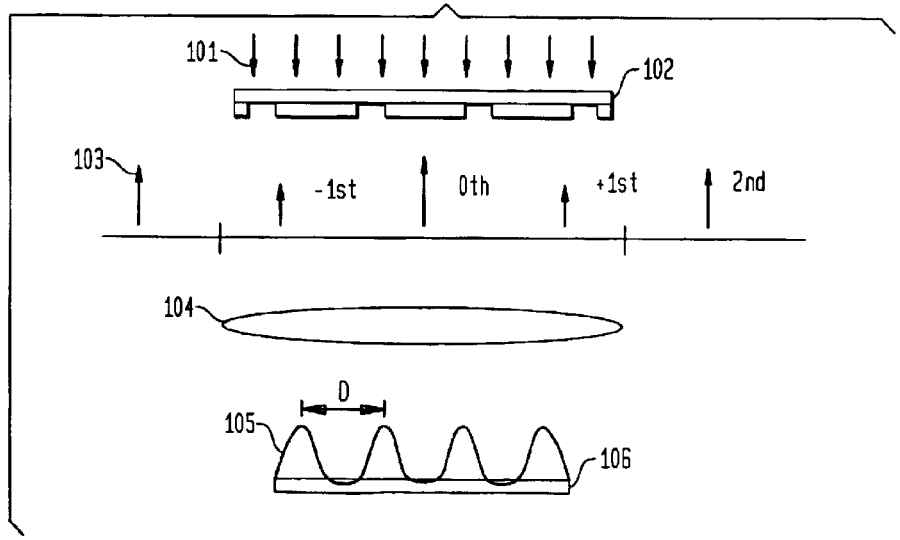
FIG. 1 is a diagram illustrating the primary elements of a projection system for carrying out a known photolithographic method.

FIG. 1 is a schematic illustration of the primary elements of a photolithographic projection system 100, such as a stepper. A vertically incident, substantially coherent light source 101 illuminates a patterned mask or reticle 102 that includes one or more lines and spaces patterns. When the lines and spaces patterns have a pitch 2L, namely there is a distance 2L from a respective location in the lines and spaces patterned to its nearest identical location in the pattern, and the pitch is within the same order of magnitude as the wavelength of the coherent light source, the light is diffracted by the lines and spaces pattern and forms a diffraction pattern 103 that includes zero-th order, positive and negative first order, positive and negative second order and higher order diffracted light beams. When the pitch 2L is near the resolution limit of the projection lens 104, only the zero-th and positive and negative first order diffracted light beams are received by the projection lens 104 and refracted onto the wafer or other substrate surface 106. When the wafer surface 106 is disposed at the focal plane of the projection lens 104, the light beams are focused onto the surface in the form of a lines and spaces pattern according to intensity distribution 105 and having a spacing D, where D=2L or D=2L×(the reduction ratio of the projection lens).

The intensity and resolution of the image projected on the wafer, however, changes as the vertical distance is changed. Specifically, the intensity I of the image formed by the projection lens 104 on an image projection plane is given by the following relation:

$$I(x, z) = [U(x, z)]^2$$
$$= (a_0^2 + 2a_1^2) + 4a_0 a_1 \cos(kx)\cos(k_0 - k')z + 2a_1^2 \cos(2kx)$$

where x is a position on the image projection plane, z is the degree of defocus, namely the distance from the focal plane, $U(x,z)$ represents the amplitude of the light on the image projection plane, $a_0$ and $a_1$ are the amplitudes of the zero-th and first order diffracted light beams, $k_0$ is the wave number of the illumination light, k is the x component of the wave number of the first order diffracted light beam, and k' is the small z component of the wave number of the first order diffracted light beam.

The second term of the equation represents an optical image having a period 2L which is equal to the pitch of the mask pattern. The second term of the equation is generated by the interference between the zero-th order diffracted light beam and either the positive first order diffracted light beam or the negative first order diffracted light beam and is dependent upon the value of the defocus z. The third term of the equation represents an optical image having a period L corresponding to one-half the pitch of the lines and spaces pattern on the mask. The third term is generated by the interference between the positive first order diffracted light beam and the negative first order diffracted light beam and is not dependent upon the defocus z.

Thus, the pitch of the lines and spaces pattern formed on the wafer is dependent upon the degree of defocus z or the vertical position of the plane of the wafer surface with respect to the projection lens. Alternatively, the second term may be eliminated by two successive exposures having intensities $I(x, z)$ and $I(x, z+\Delta)$, where $\Delta$ satisfies the condition $(k^0-k')\times\Delta=\pi$.

Figure 2:
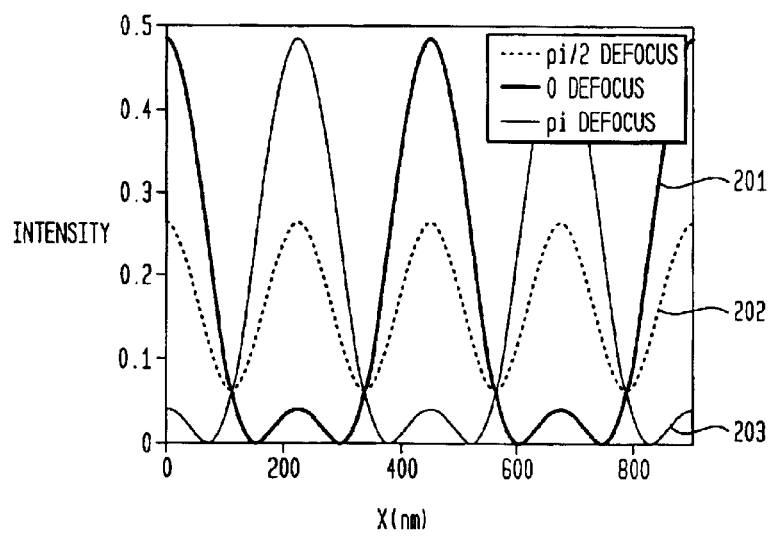
FIG. 2 is a diagram showing the intensity distribution oh a substrate as a function of position for three-beam interference using a projection system under various focus conditions.

FIG. 2 illustrates the intensity pattern for various defocus values. When the surface of the wafer is located at the focal plane of the projection lens, the lines and spaces pattern on the mask is imaged on the surface of the wafer with the same pitch 2L as that of the mask, as shown in curve 201. When the distance between the projection lens 104 and the top surface of the wafer 106 is changed by either moving the projection lens or the wafer in the vertical direction, the wafer moves out of the focal plane of the projection lens and the image of the lines and spaces pattern on the wafer gradually loses contrast and eventually disappears. When the distance between the projection lens and the top surface of the wafer is further changed until the defocus is one-half phase, namely the defocus value Δ is proportional to n/2, the lines and spaces pattern reappears on the surface of the wafer. The lines and spaces pattern, however, now appears with a pitch of L, namely one-half the pitch of the mask but with reduced intensity, as curve 202 shows. When the spacing between the projection lens and the upper surface of the wafer is further changed, the reduced pitch image again disappears until the separation distance is proportional to one full phase π. At this distance, the lines and spaces pattern reappears on the surface of: the wafer but is reversed, namely lines are now present where spaces were when the wafer was located at the focal plane and spaces are now present where lines were, as curve 203 shows.

Figure 3:
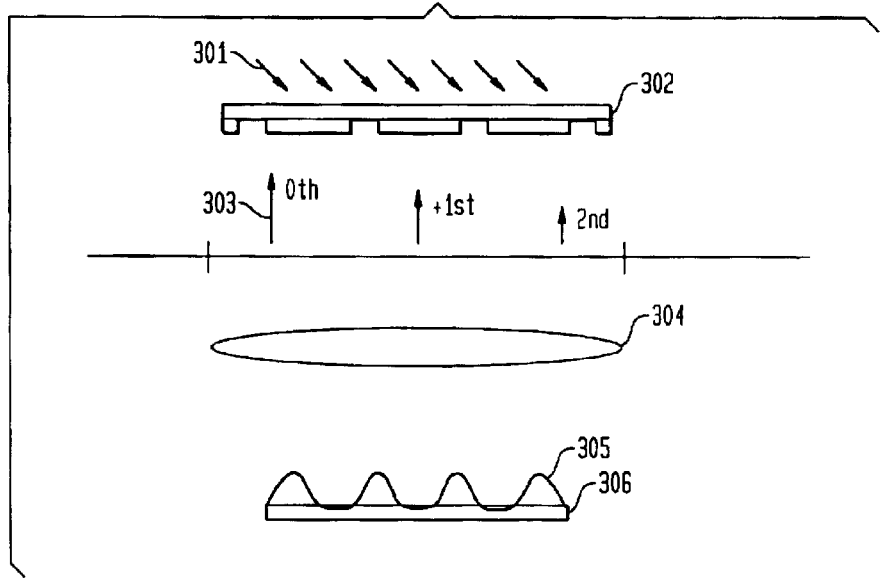
FIG. 3 is a diagram showing the primary elements of a projection system in which obliquely incident light illuminates a photolithographic mask.

The above known arrangement enables the printing of lines and spaces patterns with one-half the pitch of the mask pattern using an existing projection system in which the mask is illuminated with vertically or axially incident coherent light. However, projection systems exist in which the coherent light source illuminates the mask at an oblique angle and which therefore cannot use the known method. FIG. 3 illustrates such an arrangement. An obliquely incident coherent light source 301 illuminates a patterned mask 302 which includes lines and spaces patterns of pitch 2L. The lines and spaces patterns of the mask diffract the incident light and form zero-th, positive or negative first, positive or negative second and higher order diffracted light beams. However, because of the oblique incidence of the light source, the zero-th order, positive first order, and positive second order diffracted light beams or the zero-th order, negative first order and negative second order diffracted light beams 303 are captured by the projection lens 304, rather than the zero-th order, positive first order and negative first order diffracted light beams that are captured when vertically or axially incident light is used. Because the zero-th order and second order diffracted light beams are of different intensities, the diffracted light beams are not easily focused in the manner described above so that the quality of the image 305 formed on the surface of the wafer 306 cannot as easily be controlled.

In accordance with the invention, the standard chrome on glass mask is replaced with a half-tone phase shifting mask which adjusts the amplitude of the diffracted light beams such that the zero-th order and either the positive or negative second order diffracted light beams are adjusted to have approximately the same amplitude.

Figure 4:
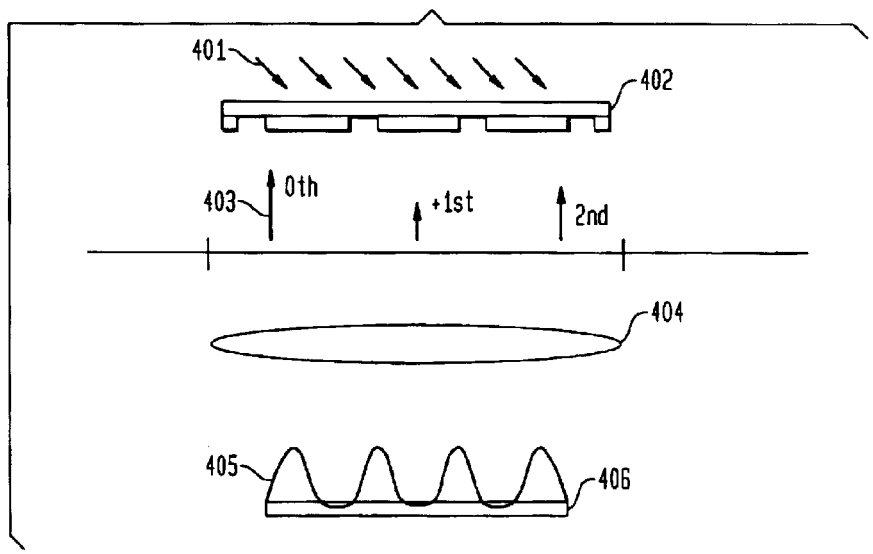
FIG. 4 is a diagram showing the primary elements of a projection system operating in accordance with a method of the invention.

FIG. 4 illustrates an arrangement in accordance with the invention. An obliquely incident, coherent light source 401 illuminates a half-tone phase shifting mask or reticle 402. The pattern on the half-tone phase shifting mask includes lines and spaces patterns of pitch 2L that diffract the obliquely incident light and form a diffraction pattern 403. The diffraction pattern includes zero-th order, positive and negative first and positive and negative second order diffracted light beams of which either the positive first and second order or negative first and second order light beams are captured by the projection lens 404 together with the zero-th order light beam. However, because a half-tone phase shifting mask is used, the intensities of the zero-th and second order diffracted light beams are substantially equal so that the diffracted light beams can be focused or defocused using the projection lens 404. As a result, when the wafer 406 is disposed at a distance A from the projection lens that is one-half phase defocused, a line and spaces pattern 405 appears on the surface of the wafer 406 having pitch L, namely one-half the pitch of the lines and spaces pattern on the mask 402.

Thus, by using a half-tone phase shifting reticle, the resolution capacity of a given projection system is significantly improved even when oblique illumination is used. As a result, photolithographic procedures that require oblique illumination may be carried out at reduced resolutions using existing exposure systems.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming a projected image on a substrate, said method comprising:

irradiating a photolithographic mask using substantially coherent light to illuminates said mask at an oblique angle of incidence with respect to a surface of said mask, said mask having a pattern that includes at least one lines and spaces pattern of periodicity P, said mask shifting a phase of light transmitted through said mask; and projecting said light transmitted through said mask via an optical projection system onto said substrate, said substrate being disposed substantially parallel with but at a distance from a focal plane of said optical projection system;

said oblique angle of incidence and said distance from said focal plane being selected such that an image projected onto said substrate includes at least one lines and spaces pattern of periodicity P/2.

2. The method of claim 1 wherein said mask is a half-tone phase shifting mask.

3. The method of claim 1 wherein said lines and spaces pattern of said mask diffracts said light transmitted through said mask to form a diffraction pattern on said substrate, said diffraction pattern having at least a zeroth order light beams, a first order light beams and a second order light beam; and said oblique angle is selected such that said mask alters an intensity of said zeroth order light beam and an intensity of said second order light beam to be substantially equal to each other.

4. The method of claim 1 wherein said method is carried out by a photolithographic projection system.

5. The method of claim 1 wherein said substantially coherent light is one of visible light, ultraviolet light and deep ultraviolet light.

6. The method of claim 1 wherein said material substrate is a semiconductor wafer.

7. A system for forming a projected image on a material substrate, said system comprising:

a photolithographic mask including a substantially transparent mask substrate and at least one lines and spaces pattern formed on said mask substrate and having a periodicity P, said mask substrate including at least one phase shifting region;

a light source for illuminating said photolithographic mask with substantially coherent light at an oblique angle of incidence with respect to a surface of a photolithographic mask; and at least one projection lens for collecting at least a portion of light that is transmitted through said photolithographic mask and for projecting said portion of said transmitted light onto said material substrate;

said material substrate being substantially parallel with, but at a distance from, a focal plane of said projection lens system; and said phase shifting region of said mask substrate and said distance from said focal plane being selected such that a substantially focused image is projected onto said material substrate that includes said lines and spaces pattern but with a periodicity P/2.

8. The system of claim 7 wherein said photolithographic mask is a half-tone phase shifting mask.

9. The system of claim 7 wherein said lines and spaces pattern of said photolithographic mask diffracts said light transmitted through said photolithographic mask to form a diffraction pattern having at least a zero-th order light beam, positive and negative first order light beams and positive and negative second order light beams; said projection lens collects said zero-th order light beam, one of said positive and negative first order light beams and a corresponding one of said positive and negative second order light beams; and said phase shifting region of said mask substrate alters an intensity of said zero-th order light beam and an intensity of said corresponding second order light beam to be substantially equal.

10. The system of claim 7 wherein said system comprises a photolithographic projection system.

11. The system of claim 7 wherein said substantially coherent light is one of visible light, ultraviolet light and deep ultraviolet light.

12. The system of claim 7 wherein said material substrate is a semiconductor wafer.

* * * * *